United States Patent
Yokoyama

(10) Patent No.: US 10,830,814 B2
(45) Date of Patent: Nov. 10, 2020

(54) SEMICONDUCTOR DEVICE

(71) Applicant: RENESAS ELECTRONICS CORPORATION, Tokyo (JP)

(72) Inventor: Yoshisato Yokoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/286,447

(22) Filed: Feb. 26, 2019

(65) Prior Publication Data
US 2019/0293716 A1 Sep. 26, 2019

(30) Foreign Application Priority Data
Mar. 23, 2018 (JP) .................. 2018-055844

(51) Int. Cl.
*G11C 11/00* (2006.01)
*G01R 31/317* (2006.01)
*G11C 11/418* (2006.01)
*G11C 11/419* (2006.01)
*G11C 11/412* (2006.01)

(52) U.S. Cl.
CPC ...... *G01R 31/31726* (2013.01); *G11C 11/412* (2013.01); *G11C 11/418* (2013.01); *G11C 11/419* (2013.01)

(58) Field of Classification Search
CPC ... G11C 11/412; G11C 11/418; G11C 11/419; G01R 31/31726
See application file for complete search history.

(56) References Cited

U.S. PATENT DOCUMENTS

| | | | | |
|---|---|---|---|---|
| 5,659,507 A | * | 8/1997 | Yabe | G11C 7/1006 365/210.13 |
| 5,719,814 A | * | 2/1998 | Ishikawa | G11C 8/08 327/51 |
| 8,009,488 B2 | * | 8/2011 | Park | G11C 11/404 365/189.07 |

FOREIGN PATENT DOCUMENTS

JP 2005-077331 A 3/2005

* cited by examiner

*Primary Examiner* — Pho M Luu
(74) *Attorney, Agent, or Firm* — McDermott Will & Emery LLP

(57) ABSTRACT

A semiconductor device includes a memory cell array, a plurality of word lines, a plurality of bit line pairs, a column selection circuit coupling a bit line pair in a selected column in the plurality of bit line pairs to first and second output signal lines on the basis of a column selection signal, and a sense amplifier amplifying the voltage difference between the first and second output signal lines. The semiconductor device further includes: a scan flip flop to which the data can be input via a scan chain; and a voltage setting circuit setting the first and second output signal lines to voltage according to the data held in the scan flip flop in a scan test.

13 Claims, 15 Drawing Sheets

SEMICONDUCTOR DEVICE

CROSS-REFERENCE TO RELATED APPLICATIONS

The disclosure of Japanese Patent Application No. 2018-055844 filed on Mar. 23, 2018 including the specification, drawings and abstract is incorporated herein by reference in its entirety.

BACKGROUND

The present disclosure relates to a semiconductor device and can be suitably used to, for example, a scan test circuit for a semiconductor storage circuit.

In a test of a semiconductor integrated circuit, a scan test circuit is generally used. A scan test circuit is obtained by configuring a shift register by coupling, in series, a plurality of flip flops used for normal operation in a semiconductor integrated circuit. Each of the flip flops is configured so that a normal input and a scan input are switched in response to a scan enable signal.

Japanese Unexamined Patent Application Publication No. 2005-077331 (patent literature 1) discloses a technique directed to obtain a scan test circuit assuring set-up time and hold time at the time of a scan shift without exerting a delay influence on a circuit used for normal operation. Concretely, the scan test circuit of the literature has a delay circuit with a selector, which adds delay time longer than delay time which is added in the case of performing normal operation, to a clock signal in the case of performing a scan test.

SUMMARY

When the timing for a clock signal in the normal operation and that in the scan test are different like in the above-described literature, a problem occurs that it becomes difficult to make the timing of a circuit to be tested and that of a circuit at a post stage met. For example, when reading time of a data which is input to a scan flip flop and reading time of the data stored in a memory cell array are largely different from each other in a semiconductor storage circuit, the timing designing of a circuit at a post stage becomes complicated.

The other problems and novel features will become apparent from the description of the present disclosure and appended drawings.

A semiconductor device according to an embodiment has a voltage setting circuit for setting voltage of a signal line on the input side of a sense amplifier to a voltage according to the data held in a scan flip flop at the time of a scan test of a semiconductor storage circuit.

According to the embodiment, the reading timing of the data held in a scan flip flop and the reading timing of the data stored in a memory cell array can be synchronized with a clock input.

DETAILED DESCRIPTION

Figure 1:
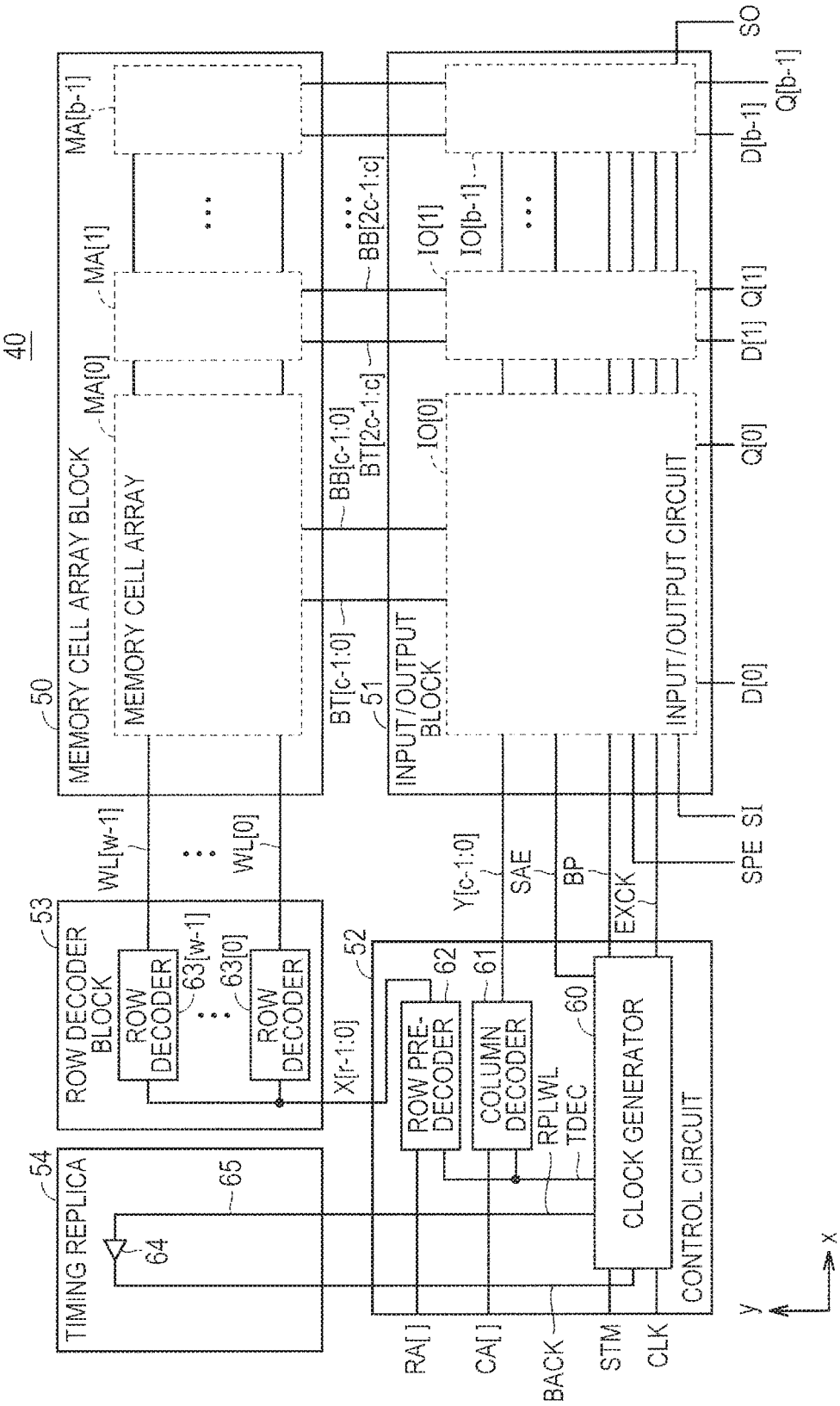
FIG. 1 is a block diagram illustrating the configuration of an SRAM circuit as a semiconductor device of a first embodiment.

Hereinafter, each of embodiments will be described specifically with reference to the drawings. In the following description, an SRAM (Static Random Access Memory) circuit will be described as a concrete example of a semiconductor device. However, the following circuit technique can be applied also to a semiconductor storage circuit other than an SRAM.

Although the logic value in the case where a signal is at the high level (H level) is set as "1" and the logic value in the case where a signal is at the low level (L level) is set as "0" in the following description, the opposite corresponding relations may be employed. In the following description, the same reference numeral is designated to the same or corresponding part and, in some cases, its description will not be repeated.

First Embodiment

Configuration of SRAM Circuit

Figure 2:
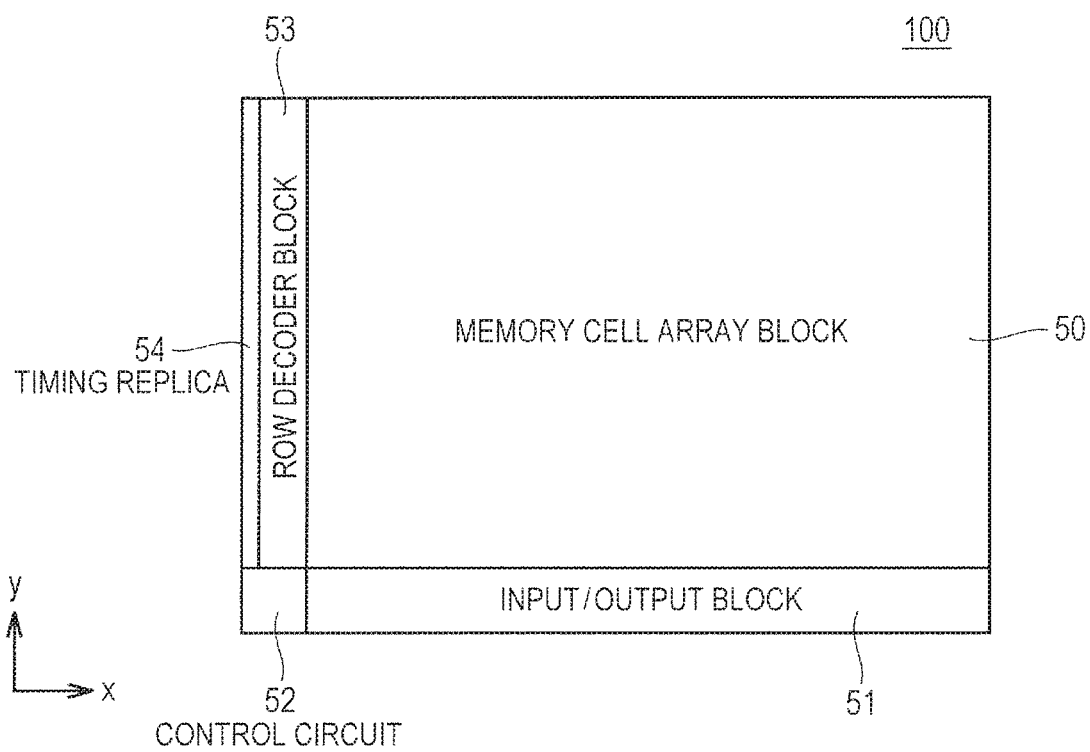
FIG. 2 is a plan view illustrating an example of the layout of the SRAM circuit of FIG. 1.

FIG. 1 is a block diagram illustrating the configuration of an SRAM circuit as a semiconductor device of a first embodiment. FIG. 2 is a plan view illustrating an example of the layout of the SRAM circuit of FIG. 1. Hereinafter, the row direction of a memory cell array will be called the x direction, and the column direction will be called the y direction.

Referring to FIGS. 1 and 2, an SRAM circuit 40 includes a memory cell array block 50, a control circuit 52, an input/output block 51, a row decoder block 53, and a timing replica 54.

In an example illustrated in FIG. 2, the input/output block 51 is provided adjacent to the memory cell array block 50 in the y direction, and the row decoder block 53 is provided adjacent to the memory cell array block 50 in the x direction. The control circuit 52 is disposed in a position adjacent to the input/output block 51 in the x direction and adjacent to the row decoder block 53 in the x direction. The timing replica 54 is disposed adjacent to the row decoder block 53 on the side opposite to the memory cell array block 50. The disposition region of the timing replica 54 extends in the y direction and is narrow in the x direction. In the following, the configuration of each of the blocks will be described more specifically.

Memory Cell Array Block

The memory cell array block 50 includes "b" pieces of memory cell arrays MA[0] to MA[b−1]. Each memory cell array MA includes a plurality of memory cells MC disposed in a matrix of "w" rows and "c" columns.

w pieces of word lines WL[0] to WL[w−1] are provided in correspondence with the rows of the memory cell array MA, and c pieces of bit line pairs BT and BB are provided in correspondence with the columns of the memory cell array MA. Each word line WL is common to the memory cell arrays MA[0] to MA[b−1].

Figure 3:
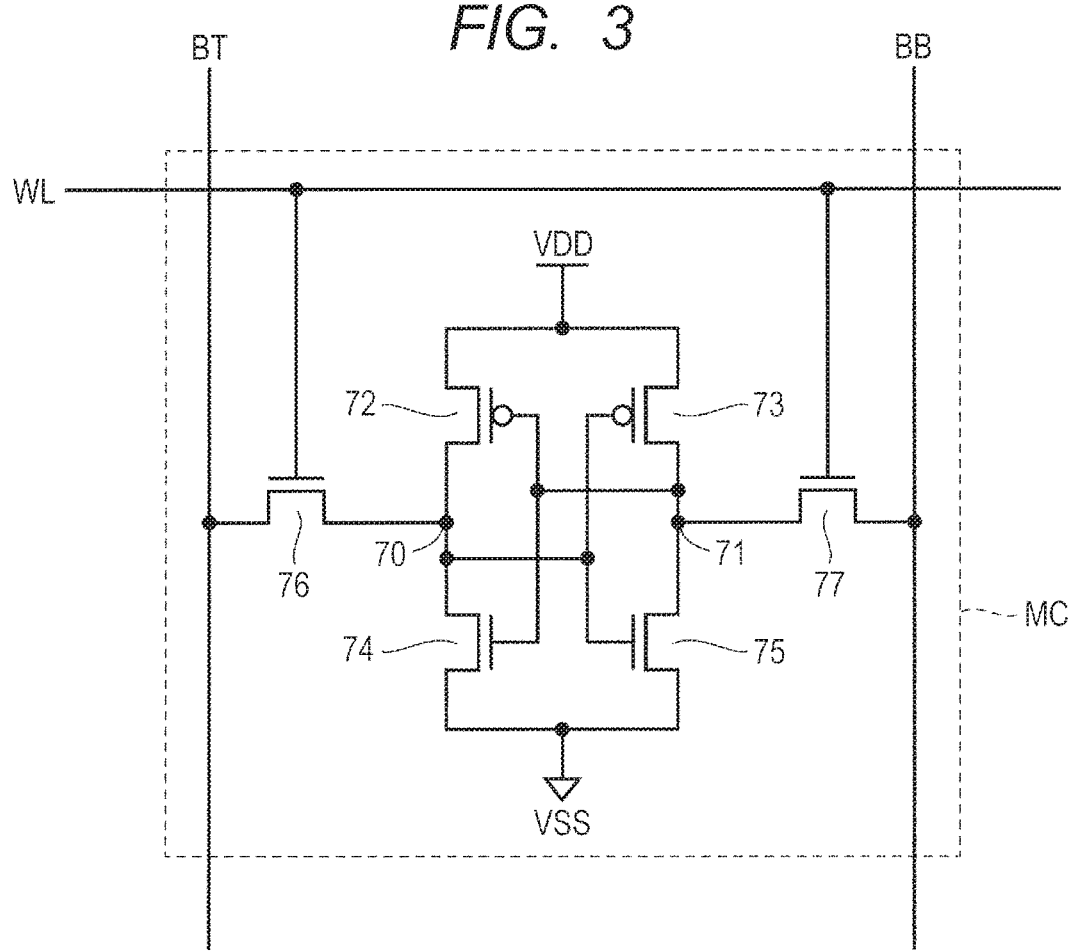
FIG. 3 is a circuit diagram illustrating the configuration of an SRAM memory cell.

FIG. 3 is a circuit diagram illustrating the configuration of an SRAM memory cell. Referring to FIG. 3, the memory cell MC includes storage nodes 70 and 71, driver PMOS transistors 72 and 73, driver NMOS transistors 74 and 75, and access NMOS transistors 76 and 77.

The storage nodes 70 and 71 hold complementary data one of which is at the high level (H level) and the other is at the low level (L level).

The driver PMOS transistor 72 is coupled between a node (hereinbelow, called "VDD power supply node") to which power supply voltage VDD is applied and the storage node 70 as one of the storage nodes. The driver PMOS transistor 73 is coupled between the VDD power supply node and the other storage node 71. The driver NMOS transistor 74 is coupled between the node (hereinbelow, called "VSS power supply node") to which grounding voltage VSS is applied and the storage node 70. The driver NMOS transistor 75 is coupled between the VSS power supply node and the storage node 71. The gates of the driver PMOS transistor 72 and the driver NMOS transistor 74 are coupled to the storage node 71. The gates of the driver PMOS transistor 73 an the driver NMOS transistor 75 are coupled to the storage node 70. By the above-described coupling, the MOS transistors 72 to 75 configure a latch circuit.

The access NMOS transistor 76 is coupled between the storage node 70 and the bit line BT. The access NMOS transistor 77 is coupled between the storage node 71 and the bit line BB. The gates of the access NMOS transistors 76 and 77 are coupled to the corresponding word line WL. With the configuration, when a selection signal of the corresponding word line WL is activated, the potential of the pair of bit lines BT and BB changes according to the complementary data stored in the storage nodes 70 and 71. The potential change in the pair of bit lines BT and BB is detected by a sense amplifier SA.

Control Circuit and Row Decoder Block

Referring to FIG. 1, the control circuit 52 includes a clock generator 60, a column decoder 61, and a row pre-decoder 62. The row decoder block 53 includes w pieces of row decoders 63[0] to 63[w−1] corresponding to the word lines WL individually. Hereinafter, each of the components will be described.

Clock Generator

Figure 4:
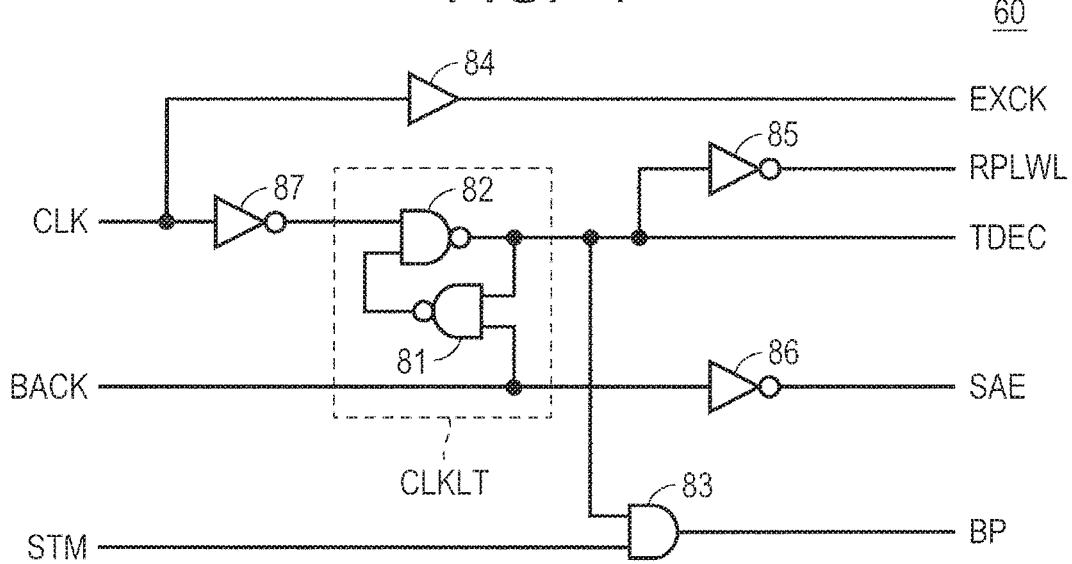
FIG. 4 is a circuit diagram illustrating an example of the configuration of a clock generator in FIG. 1.

FIG. 4 is a circuit diagram illustrating an example of the configuration of the clock generator in FIG. 1. The clock generator 60 receives a clock signal CLK and a scan test mode signal STM from the outside. When the scan test mode signal STM=0, the normal operation mode is set. When STM=1, a scan test is executed.

Referring to FIGS. 1 and 4, the clock generator 60 includes a clock latch circuit CLKLT, a buffer 84, inverters 85 to 87, and an AND gate 83.

The clock latch circuit CLKLT includes NAND gates 81 and 82. The clock signal CLK is input to the first input node of the NAND gate 82 via the inverter 87, and an output signal of the NAND gate 81 is input to the second input node of the NAND gate 82. The output signal of the NAND gate 82 is output as an internal clock signal TDEC to the column decoder 61 and the row pre-decoder 62.

Further, a signal obtained by inverting the logic level of the internal clock signal TDEC by the inverter 85 is output as an RPLWL signal to the timing replica 54. The timing replica 54 includes delay lines 65 which stimulate the bit lines BT and BB. The delay line 65 may be provided with a buffer 64.

The internal clock signal TDEC is input to the first input node of the NAND gate 81. The RPLWL signal delayed by the timing replica 54 is input as a BACK signal to the second input node of the NAND gate 81. Further, a signal obtained by inverting the logic level of the BACK signal by the inverter 85 is output as a sense amplifier activate signal SAE to the input/output block 51.

The AND gate 83 outputs the AND of the internal clock signal TDEC and the scan test mode signal STM as a bypass selection signal BP to the input/output block 51.

Further, the clock generator 60 shapes the clock signal CLK by the buffer 84 and, after that, outputs the resultant as an external clock signal EXCK to the input/output block 51. Therefore, the external clock signal EXCK is a signal synchronized with the clock signal CLK.

Column Decoder, Row Pre-Recorder, and Row Decoder

Figure 5:
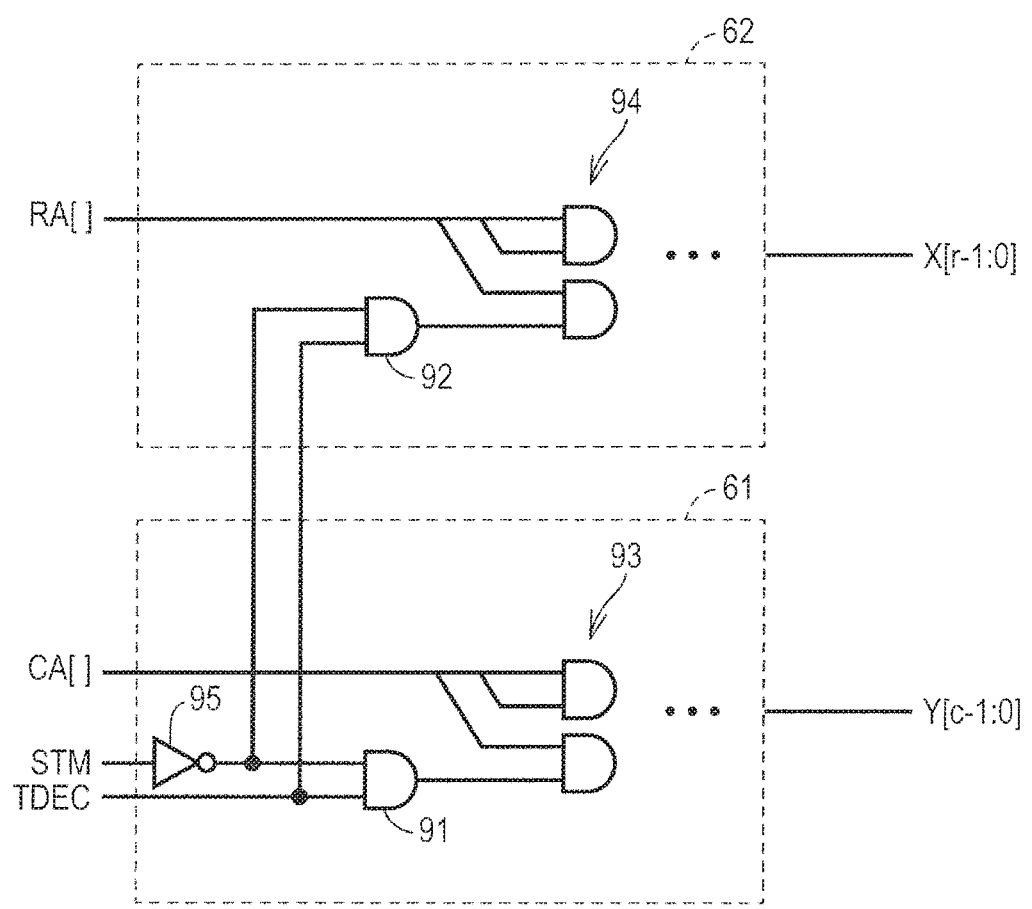
FIG. 5 is a schematic diagram illustrating a configuration example of a column decoder and a row pre-recorder in FIG. 1.

FIG. 5 is a schematic diagram illustrating a configuration example of a column decoder and a row pre-recorder in FIG. 1.

Referring to FIGS. 1 and 5, the column decoder 61 includes an AND gate 91, an inverter 95, and a decode circuit 93. The AND gate 91 outputs the AND of the internal clock signal TDEC and a signal obtained by inverting the logic level of the scan test mode signal STM by the inverter 95. When the output of the AND gate 91 is in an active state (H level), the decode circuit 93 decodes the column address CA[ ] and outputs a column selection signal Y[c−1:0] according to the column address CA[ ] to the input/output block 51. Therefore, the column decoder 61 outputs a column selection signal Y synchronously with the internal clock signal TDEC when STM=0 but does not output the column selection signal Y when STM=1.

The row pre-decoder 62 includes an AND gate 92 and a decode circuit 94. The AND gate 92 outputs the AND of a signal obtained by inverting the logic level of the scan test mode signal STM by the inverter 95 and the internal clock signal TDEC. When the output of the AND gate 92 is in an active state (H level), the decode circuit 94 decodes the row address RA[ ] and outputs a row selection signal X[r−1:0] according to the row address RA[ ] to the row decoder block 53. Therefore, the column decoder 61 outputs the row selection signal X synchronously with the internal clock signal TDEC when STM=0, but does not output the row selection signal X when STM=1.

The row decoder block 53 includes the row decoders 63[0] to 63[w−1] corresponding to the word lines WL. Each row decoder 63 activates the corresponding word line WL on the basis of the row selection signal X.

Input/Output Block

The input/output block 51 includes input/output circuits IO[0] to IO[b−1] corresponding to the memory cell arrays MA[0] to MA[b−1], respectively.

The input/output block 51 has an input terminal of scan in a data SI and an output terminal of scan out a data SO to execute a scan test. Further, each input/output circuit IO has an input terminal of a write data D to the memory cell array MA and an output terminal of a read data Q from the memory cell array MA.

To the input/output block 51, a common scan path activate signal SPE is input in each input/output circuit IO. When SPE=1, the scan in the data SI can be input to each input/output circuit IO via a scan path. When SPE=0, the write data D can be input to each input/output circuit IO.

As already described, the sense amplifier activate signal SAE, the bypass selection signal BP, and the external clock signal EXCK are input from the clock generator to the input/output block 51. The column selection signal Y is input from the column decoder 61 to the input/output block 51. Those signals are commonly used in each input/output circuit IO.

Figure 6:
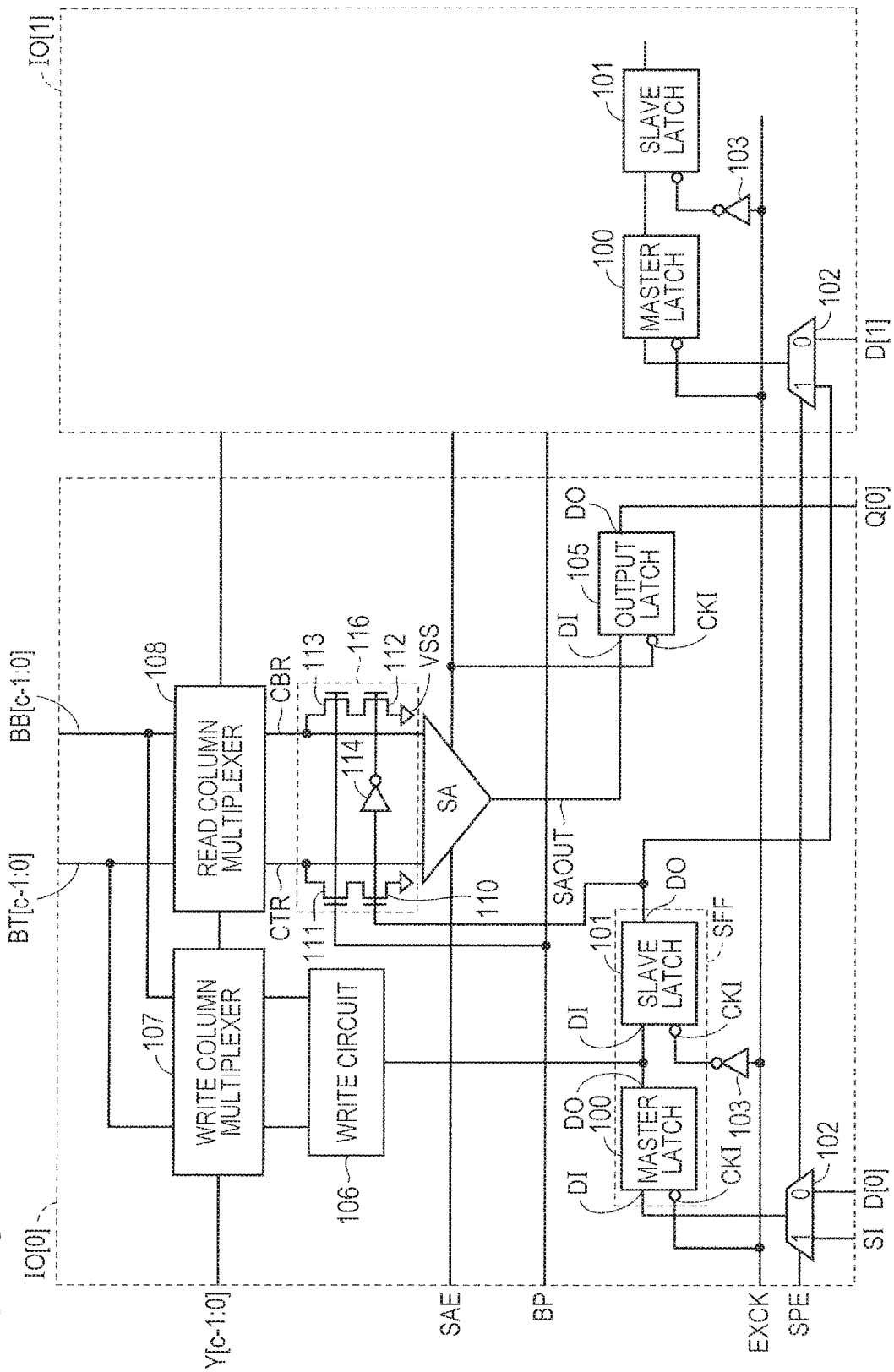
FIG. 6 is a diagram illustrating an example of an input/output circuit in FIG. 1.

FIG. 6 is a diagram illustrating an example of the input/output circuit in FIG. 1. Referring to FIG. 6, the input/output circuit IO includes a multiplexer 102, a master latch circuit 100, a slave latch circuit 101, an inverter 103, a write circuit 106, a write column multiplexer 107, a read column multiplexer 108, output signal lines CTR and CBR, the sense amplifier SA, an output latch circuit 105, and a voltage setting circuit 116. Each latch circuit has a data input node DI, a data output node DO, and a clock input node CKI.

The multiplexer 102 as an input selection circuit receives the scan in the data and the write data D. The multiplexer 102 outputs the write data D to the master latch circuit 100 when the scan activate signal SPE=0, and outputs the scan in a data SI to the master latch circuit 100 when SPE=1.

The master latch circuit 100 holds the scan in the data SI or the write data D output from the multiplexer 102 when the external clock signal EXCK is at the L level. The slave latch circuit 101 holds a signal output from the master latch circuit 100 when the external clock signal EXCK is at the H level. Therefore, by the master latch circuit 100 and the slave latch circuit 101, a scan flip flop SFF which holds a input data at the timing when the external clock signal EXCK changes from the H level to the L level is configured.

The write circuit 106 drives one of the pair of bit lines BT and BB in a selection column selected by the write column multiplexer 107 to the H level and drives the other to the L level on the basis of the data held in the master latch circuit 100.

The write column multiplexer 107 couples the pair of bit lines BT and BB in the column designated by the column selection signal Y to the write circuit 106.

The read column multiplexer 108 couples the pair of bit lines BT and BB in the column designated by the column selection signal Y to the output signal lines CTR and CBR, respectively.

When the sense amplifier activate signal SAE is in the active state, the sense amplifier SA amplifies the voltage difference between the output signal line CTR and the output signal line CBR. The sense amplifier SA outputs the logic level of one of the output signal lines as a sense amplifier output signal SAOUT.

When the sense amplifier active signal SAE is at the L level, the output latch circuit 105 holds the sense amplifier output signal SAOUT. The sense amplifier output signal SAOUT held in the output latch circuit 105 is output as the read data Q.

At the time of a scan test, the voltage setting circuit 116 sets the output signal line CTR and the output signal line CBR to voltage according to the data held in the scan flip flop SFF. Concretely, the voltage setting circuit 116 includes NMOS transistors 111 and 110, NMOS transistors 113 and 112, and an inverter 114.

The NMOS transistors 111 and 110 are coupled in this order between the output signal line CTR and the VSS power supply node. The NMOS transistors 113 and 112 are coupled in this order between the output signal line CBR and the VSS power supply node.

The bypass selection signal BP is input to the gates of the NMOS transistors 111 and 113. A voltage value according to the data held in the slave latch circuit 101 is input to the gate of the NMOS transistor 110. A signal obtained by inverting the logic level of the data held in the slave latch circuit 101 by the inverter 114 is input to the gate of the NMOS transistor 112.

When the scan test mode signal STM=1 and the internal clock signal TDEC is in the active state, the bypass selection signal BP becomes an active state (H level). When the bypass selection signal BP is in the active state, the NMOS transistors 111 and 113 become the on state. By the above, the voltage value of the output signal lines CTR and CBR is set to the voltage according to the data held in the slave latch circuit 101.

A MOS transistor as a component of the voltage setting circuit 116 can be coupled between the output signal lines CTR and CBR and the VDD power supply node. In this case, a PMOS transistor is used in place of the NMOS transistor.

Circuit Example of Sense Amplifier

Figure 7:
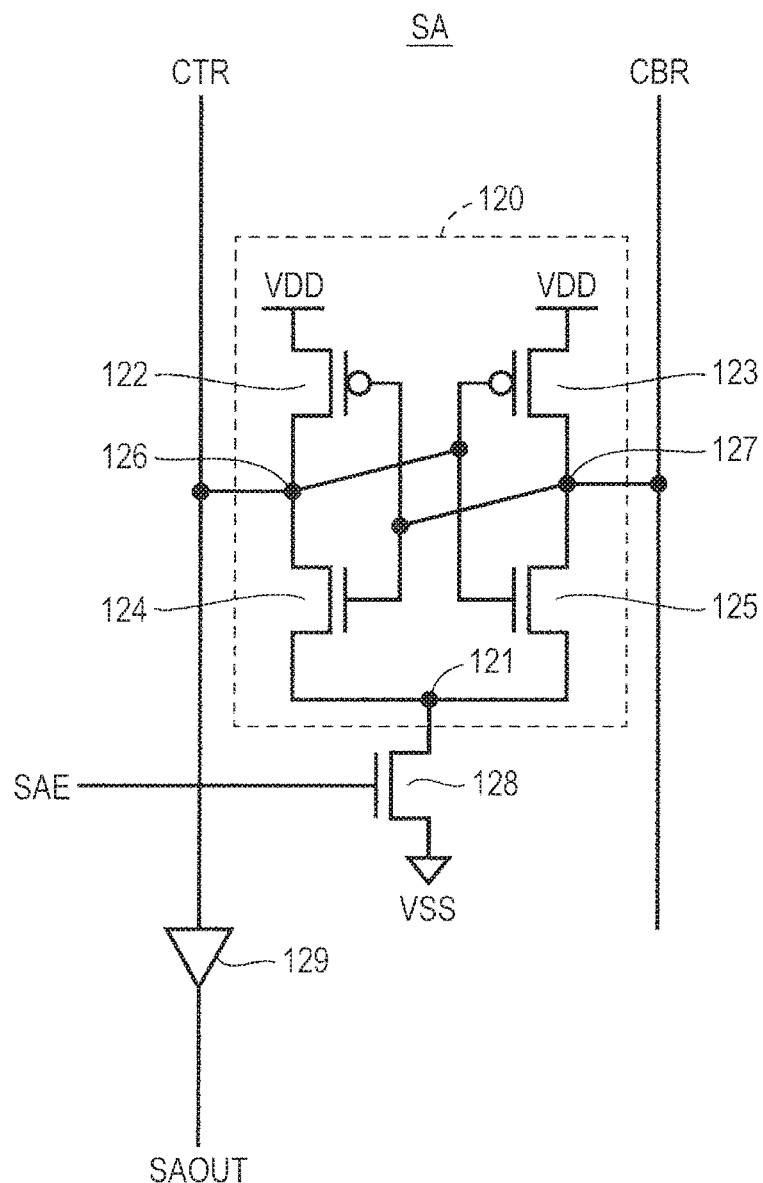
FIG. 7 is a circuit diagram illustrating an example of a sense amplifier in FIG. 6.

FIG. 7 is a circuit diagram illustrating an example of the sense amplifier in FIG. 6. The sense amplifier SA includes a latch circuit 120, an NMOS transistor 128, and a buffer 129. The latch circuit 120 includes PMOS transistors 122 and 123 and NMOS transistors 124 and 125.

The PMOS transistor 122 and the NMOS transistor 124 are coupled in series in this order between the VDD power supply node and an intermediate node 121. The PMOS transistor 123 and the NMOS transistor 125 are coupled in series in this order between the VDD power supply node and the intermediate node 121. A coupling node 126 between the PMOS transistor 122 and the NMOS transistor 124 is coupled to the gates of the PMOS transistor 123 and the NMOS transistor 125 and coupled to the output signal line CTR. Similarly, a coupling node 127 between the PMOS transistor 123 and the NMOS transistor 125 is coupled to the gates of the PMOS transistor 122 and the NMOS transistor 124 and coupled to the output signal line CBR.

The NMOS transistor 128 is coupled between the intermediate node 121 and the VSS power supply node. To the gate of the NMOS transistor 128, the sense amplifier active signal SAE is input. The buffer 129 amplifies the voltage of the output signal line CTR and outputs the amplified voltage.

When the sense amplifier activate signal SAE is in the active state, the sense amplifier SA with the above-described configuration amplifies the voltage difference between the output signal lines CTR and CBR. In this case, the voltage of one of the output signal lines becomes the power supply voltage VDD, and the voltage of the other output signal line becomes the grounding voltage VSS. The voltage after the amplification (the power supply voltage VDD or the grounding voltage VSS) is output as a sense amplifier output signal SAOUT via the buffer 129.

Circuit Example of Read Column Multiplexer

Figure 8:
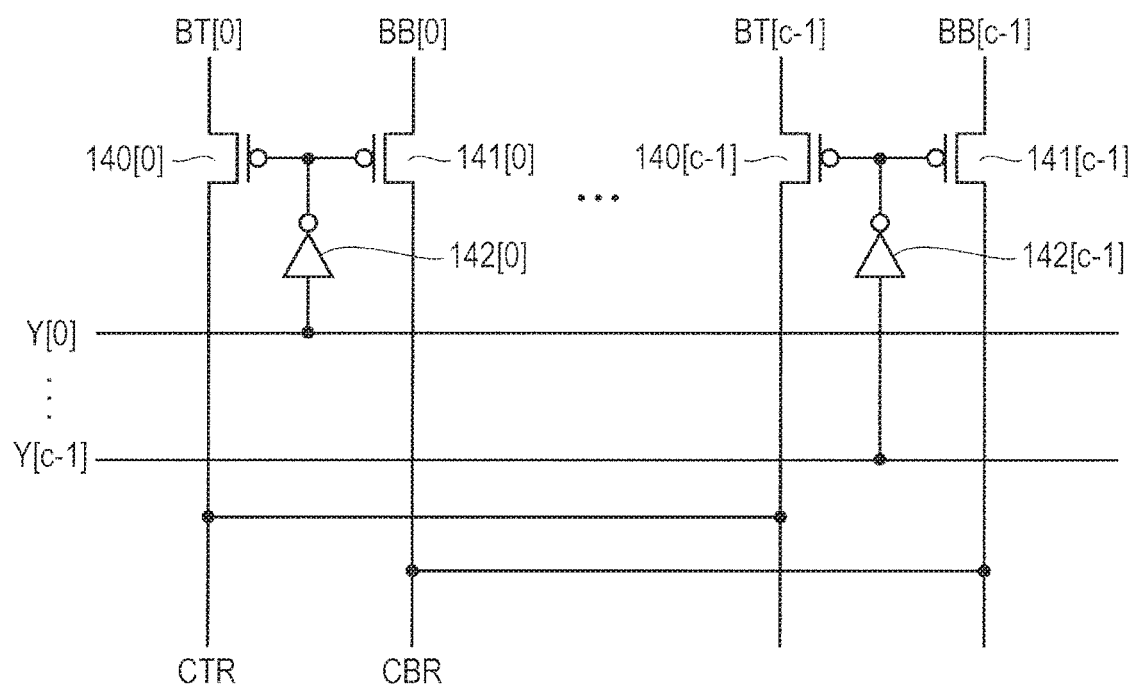
FIG. 8 is a diagram illustrating an example of the configuration of a read column multiplexer in FIG. 6.

FIG. 8 is a diagram illustrating an example of the configuration of the read column multiplexer in FIG. 6. Referring to FIG. 8, the read column multiplexer 108 includes PMOS transistors 140 and 141 coupled to the pair of bit lines BT and BB of each column and an inverter 142. The corresponding column selection signal Y is input to the gates of the PMOS transistors 140 and 141 via the inverter 142.

The bit line BT in each column is coupled to the output signal line CTR via the PMOS transistor 140. The bit line BB in each column is coupled to the output signal line CBR via the PMOS transistor 141.

With the configuration, when the corresponding column selection signal Y becomes the active state (H level), the PMOS transistors 140 and 141 become the on state, so that the bit lines BT and BB in the selected column are coupled to the output signal lines CTR and CBR, respectively.

Circuit Example of Latch Circuit

Figure 9:
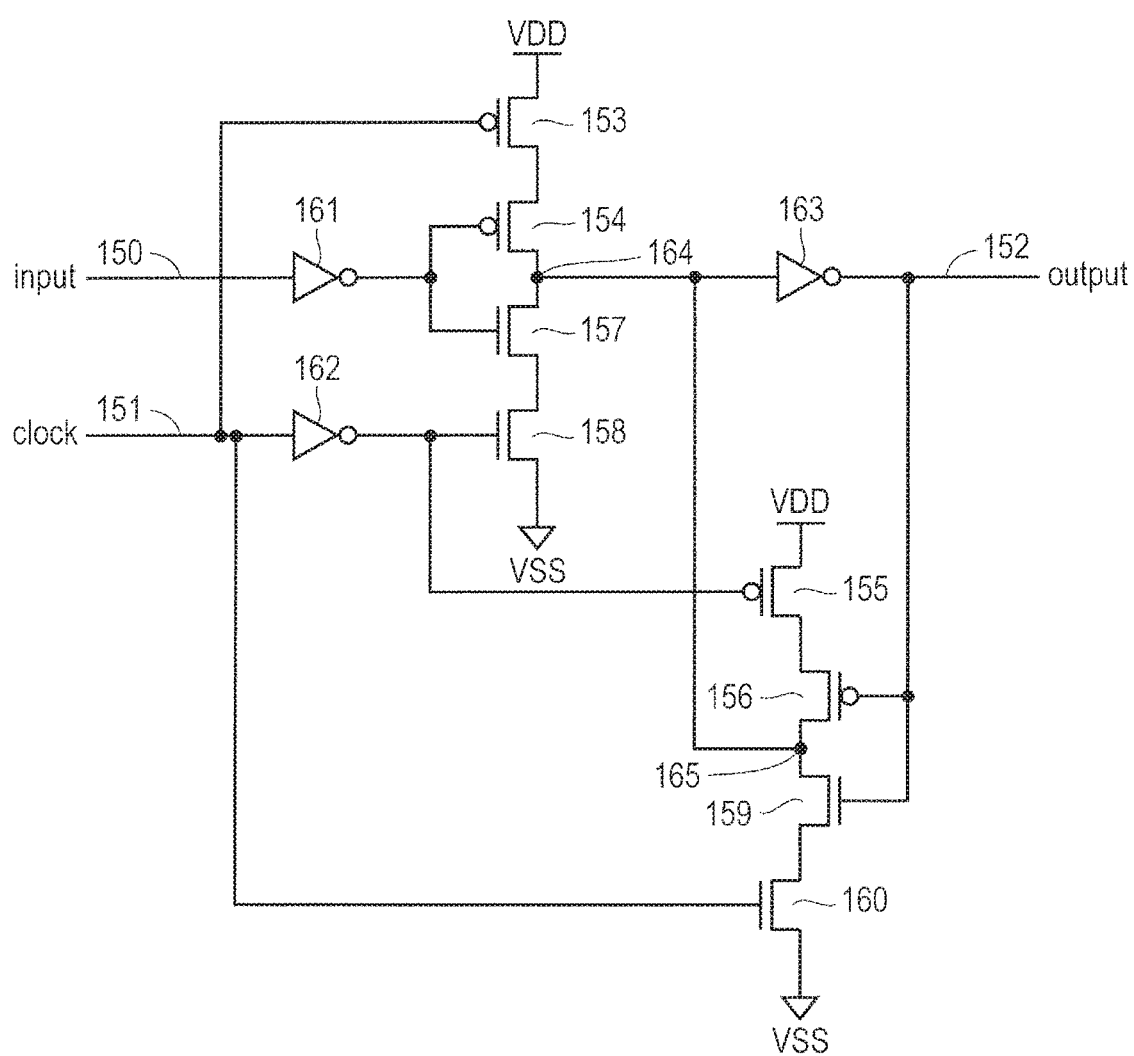
FIG. 9 is a circuit diagram illustrating an example of the configuration of a latch circuit in FIG. 6.

FIG. 9 is a circuit diagram illustrating an example of the configuration of a latch circuit in FIG. 6. Referring to FIG. 9, the latch circuit includes an input node 150, a clock node 151, an output node 152, PMOS transistors 153, 154, 155, and 156, NMOS transistors 157, 158, 159, and 160, and inverters 161, 162, and 163.

The PMOS transistors 153 and 154 and the NMOS transistors 157 band 158 are coupled in this order in series between the VDD power supply node and the VSS power supply node. Similarly, the PMOS transistors 155 and 156 and the NMOS transistors 159 and 160 are coupled in this order in series between the VDD power supply node and the VSS power supply node. The input node 150 is coupled to the gate of the PMOS transistor 154 and the gate of the NMOS transistor 157 via the inverter 161. The clock node 151 is coupled to the gate of the PMOS transistor 153 and the gate of the NMOS transistor 160. The clock node 151 is further coupled to the gate of the NMOS transistor 158 and the gate of the PMOS transistor 155 via the inverter 162. A coupling node 164 between the PMOS transistor 154 and the NMOS transistor 157 is coupled to a coupling node 165 between the PMOS transistor 156 and the NMOS transistor 159. The coupling node 164 is further coupled to the output node 152 via the inverter 163. The output node 152 is also coupled to the gate of the PMOS transistor 156 and the gate of the NMOS transistor 159.

According to the above-described configuration, when a clock signal which is input to the clock node 151 is at the L level, the PMOS transistor 153 and the NMOS transistor 158 are in the on state, and the PMOS transistor 155 and the NMOS transistor 160 are in the off state. Therefore, an input signal which is input from the input node 150 is inverted by the inverter 161, after that, inverted by an inverter comprised of the PMOS transistor 154 and the NMOS transistor 157, further, inverted by the inverter 163, and output as an output signal from the output node 152. That is, a signal obtained by inverting the logic level of the signal input from the input node 150 is output from the output node 152.

On the other hand, when the clock signal input to the clock node 151 is at the H level, the PMOS transistor 153 and the NMOS transistor 158 become the off state, so that input of the input signal from the input node 150 is interrupted. Further, when the clock signal is at the H level, the PMOS transistor 155 and the NMOS transistor 160 become the on state. Therefore, the inverter comprised of the PMOS transistor 156 and the NMOS transistor 159 and the inverter 163 are in a state where the input of one of them and the output of the other are coupled mutually, so that information of one bit can be held.

Operation of SRAM Circuit

Next, in the SRAM circuit with the above-described configuration, the operation in the case of the normal mode of the scan test mode signal STM=0 and that in the case of the scan test (also called bypass mode) of the scan test mode signal SIM=1 will be described. At the time of the scan test, by preliminarily setting that the scan path active signal SPE=1, the scan in data SI is transferred to the scan flip flop SFF (that is, the master latch circuit 100 and the slave latch circuit 101).

Figure 10:
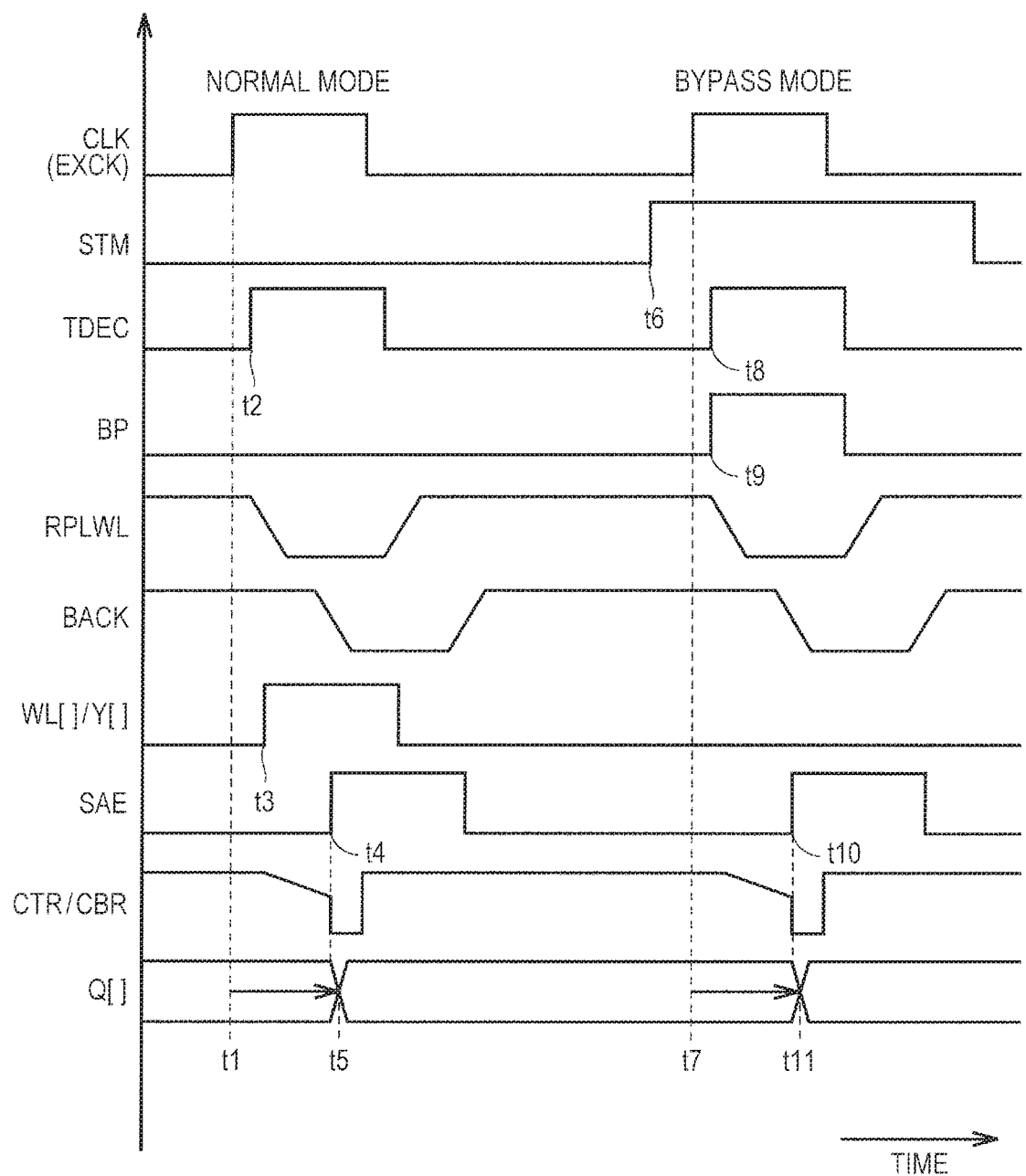
FIG. 10 is a timing chart for explaining the operation of the SRAM circuit of FIG. 1.

FIG. 10 is a timing chart for explaining the operation of the SRAM circuit of FIG. 1. First, the case of the normal mode (STM=0) will be described.

Referring mainly to FIGS. 4, 6, and 10, in a state where the clock signal CLK before time t1 is at the L level, the internal clock signal TDEC, the bypass selection signal BP, and the sense amplifier active signal SAE are at the L level. On the other hand, the RPLWL signal and the BACK signal are at the H level.

At time t1, the clock signal CLK (the external clock signal EXCK) changes from the L level to the H level. Accordingly, at time t2, the internal clock signal TDEC changes from the L level to the H level. Since STM=0, the bypass selection signal BP remains at the L level.

By the change of the internal clock signal TDEC from the L level to the H level, the RPLWL signal which is output to the delay line 65 of the timing replica 54 starts gently changing from the H level to the L level. Further, in response to the change of the internal clock signal TDEC, at time t3, the column selection signal Y is output from the column decoder 61, and the word line WL in the selected row is activated by the row decoder 63.

When delay time according to the delay line 65 provided for the timing replica 54 lapses, the BACK signal changes from the H level to the L level. By the change of the BACK signal, at time t4, the sense amplifier active signal SAE changes to the active state (H level). Consequently, the sense amplifier SA operates, so that one of the output signal lines CTR and CBR changes to the H level in accordance with the voltages of the pair of bit lines BT and BB in the selected column, and the other changes to the L level. Further, the read data Q is output from the sense amplifier SA.

When the sense amplifier active signal SAE becomes an inactive state (L level), the read data Q held in the output latch circuit 105 is output.

Next, the case of the bypass mode will be described. At time t6, the scan test mode signal STM changes from the L level to the H level. After that, at time t7, the clock signal CLK (external clock signal EXCK) changes from the L level to the H level. Accordingly, at time t8, the internal clock signal TDEC also changes from the L level to the H level.

When the internal clock signal TDEC changes from the L level to the H level, the RPWL signal output to the delay line 65 of the timing replica 54 starts gently changing from the H level to the L level. However, in the case where STM=1 as described with reference to FIG. 5, the row selection signal X and the column selection signal Y are not output.

On the other hand, as described with reference to FIG. 4, when the internal clock signal TDEC changes to the H level, at time t9, the bypass selection signal BP changes to the active state (H level). When the bypass selection signal BT becomes the H level, the NMOS transistors 111 and 113 in FIG. 6 are made conductive, and the voltage of the output signal lines CTR and CBR becomes the voltage value according to the data held in the master latch circuit 100 and the slave latch circuit 101.

After that, when delay time according to the delay line provided for the timing replica 54 lapses, the BACK signal changes from the H level to the L level. By the change of the BACK signal, at time t10, the sense amplifier active signal SAE changes to the active state (H level). By the change, the sense amplifier SA operates, so that the voltage of the output signal lines CTR and CBR is amplified by the sense amplifier SA and the amplified voltage is output as the read data Q.

The output data is a data held in the scan flip flop SFF (the master latch circuit 100 and the slave latch circuit 101). When the sense amplifier active signal SAE becomes an inactive state (L level), the output data Q held in the output latch circuit 105 is output.

Effects of First Embodiment

As described above, according to the SRAM circuit of the first embodiment, in both the normal mode and the bypass mode, the sense amplifier active signal SAE is activated at the timing based on the timing replica 54, and the data is output via the sense amplifier SA. Therefore, the time until data is output from the rising edge of the clock signal CLK in the normal mode (from time t1 to time t5 in FIG. 10) and that in the bypass mode (from time t7 to t10 in FIG. 10) are almost the same. As a result, the operation timing window of the logic circuit at a post stage of the SRAM circuit can be made wider than ever, so that the timing design becomes easier.

Second Embodiment

An SRAM circuit of a second embodiment is different from the case of the first embodiment with respect to the configuration of a voltage setting circuit 116A provided for the input/output circuit IO of the input/output block 51. Hereinafter, it will be described with reference to the drawings.

Configuration of Input/Output Circuit

Figure 11:
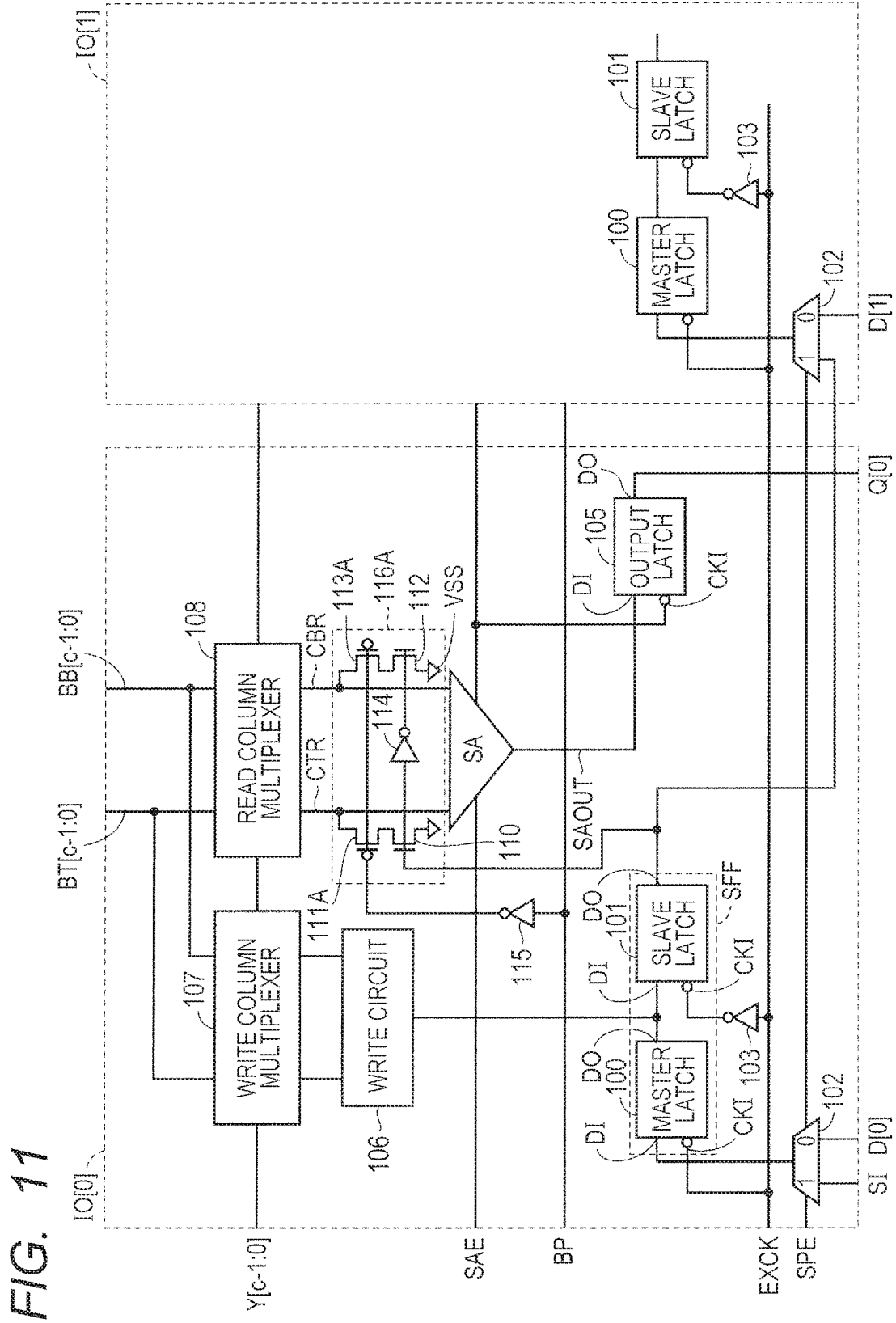
FIG. 11 is a diagram illustrating the configuration of an input/output circuit in an SRAM circuit as a semiconductor device of a second embodiment.

FIG. 11 is a diagram illustrating the configuration of an input/output circuit in an SRAM circuit as a semiconductor device of the second embodiment.

The voltage setting circuit 116A in the input/output circuit IO in FIG. 11 is different from the voltage setting circuit 116 in the input/output circuit IO in FIG. 6 with respect to the point that PMOS transistors 111A and 113A are provided in place of the NMOS transistors 111 and 113 coupled to the output signal lines CTR and CBR, respectively. Further, the input/output circuit IO in FIG. 11 is different from the input/output circuit IO in FIG. 6 with respect to the point that a signal obtained by inverting the logic level of the bypass selection signal BP is supplied to the gates of PMOS transistors 111A and 113A via an inverter 115. Since the other points in FIG. 11 are similar to those in FIG. 6, the same reference numeral is designated to the same or corresponding part and its description will not be repeated.

The operation of the voltage setting circuit 116A in the input/output circuit IC in FIG. 11 is similar to that of the voltage setting circuit 116 in FIG. 6. In the bypass mode (STM=1), when the internal clock signal TDEC is activated, the bypass selection signal BP is activated. By the operation, the PMOS transistors 111A and 113A are made conductive, so that the voltage of the output signal lines CTR and CBR becomes the voltage value according to the data held in the master latch circuit 100 and the slave latch circuit 101.

Effects of Second Embodiment

The read column multiplexer 108 is comprised of a PMOS transistor. An access transistor in a memory cell is comprised of an NMOS transistor. As described above, in the normal mode, both of the PMOS transistor and the NMOS transistor are related to reading. It is therefore preferable to use both a PMOS transistor and an NMOS transistor also in the bypass mode in order to align timings.

The other effects are similar to those in the first embodiment.

Third Embodiment

In the column decoder 61 and the row pre-decoder 62 in the first embodiment described with reference to FIG. 5, it is controlled so that both of the bit lines BT and BB and the word line WL are not selected in the bypass mode (STM=1). On the other hand, in the third embodiment, it is controlled so that only the word line is not selected. Hereinbelow, concrete description will be given with reference to the drawings.

Figure 12:
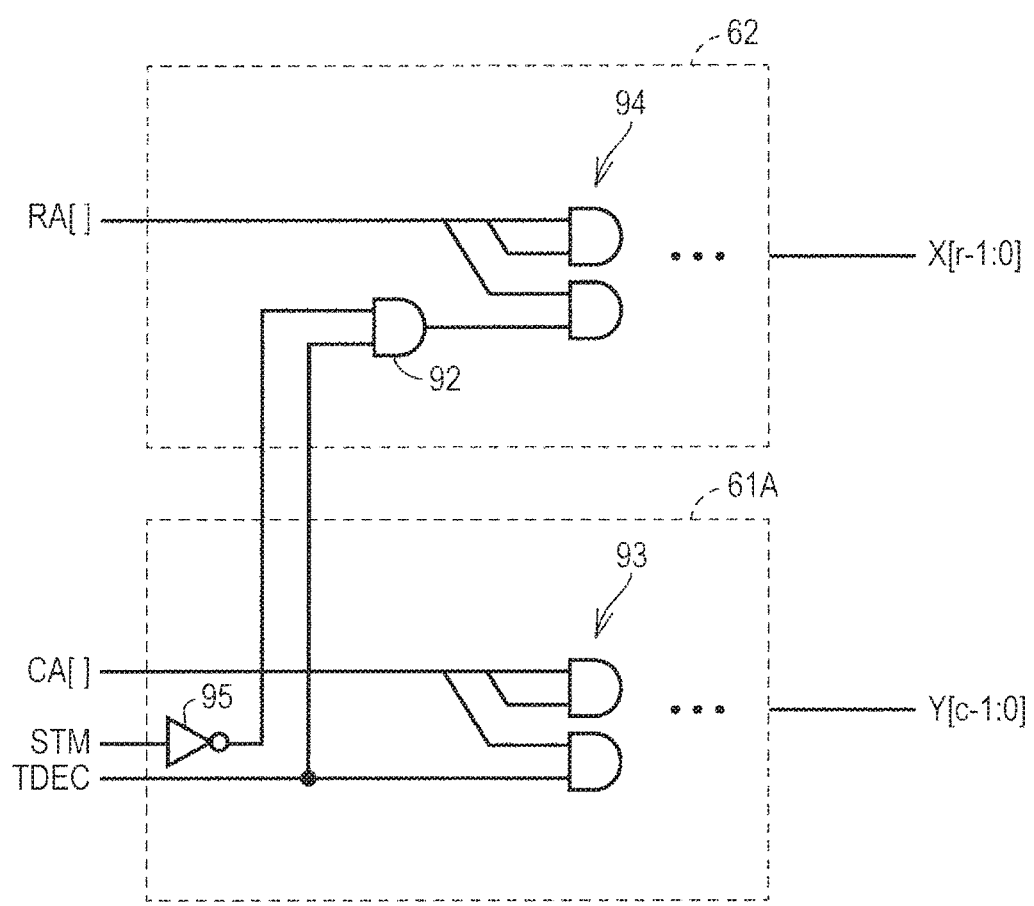
FIG. 12 is a diagram schematically illustrating the configuration of a column decoder and a row pre-decoder used in an SRAM circuit as a semiconductor device of a third embodiment.

FIG. 12 is a diagram schematically illustrating the configuration of a column decoder and a row pre-decoder used in an SRAM circuit as a semiconductor device of a third embodiment. A column decoder 61A in FIG. 12 is not provided with the AND gate 91 and is configured to output the column selection signal Y when the internal clock signal TDEC is activated regardless that the scan test mode signal STM is made active or inactive. The column decoder 61A in FIG. 12 is different from the column decoder 61 in FIG. 5 with respect to this point. That is, in the case of FIG. 12, although column selection is performed, row selection is not performed.

With the configuration, the circuit area can be reduced without exerting influence on the data output timing in the bypass mode.

Fourth Embodiment

Also in the column decoder 61 and the row pre-decoder 62 in the first embodiment described with reference to FIG. 5, in the bypass mode (STM=1), it is controlled so that both of the bit lines BT and BB and the word line WL are not selected. On the other hand, in the fourth embodiment, it is controlled so that only the bit line is not selected. Hereinafter, concrete description will be given with reference to the drawings.

Figure 13:
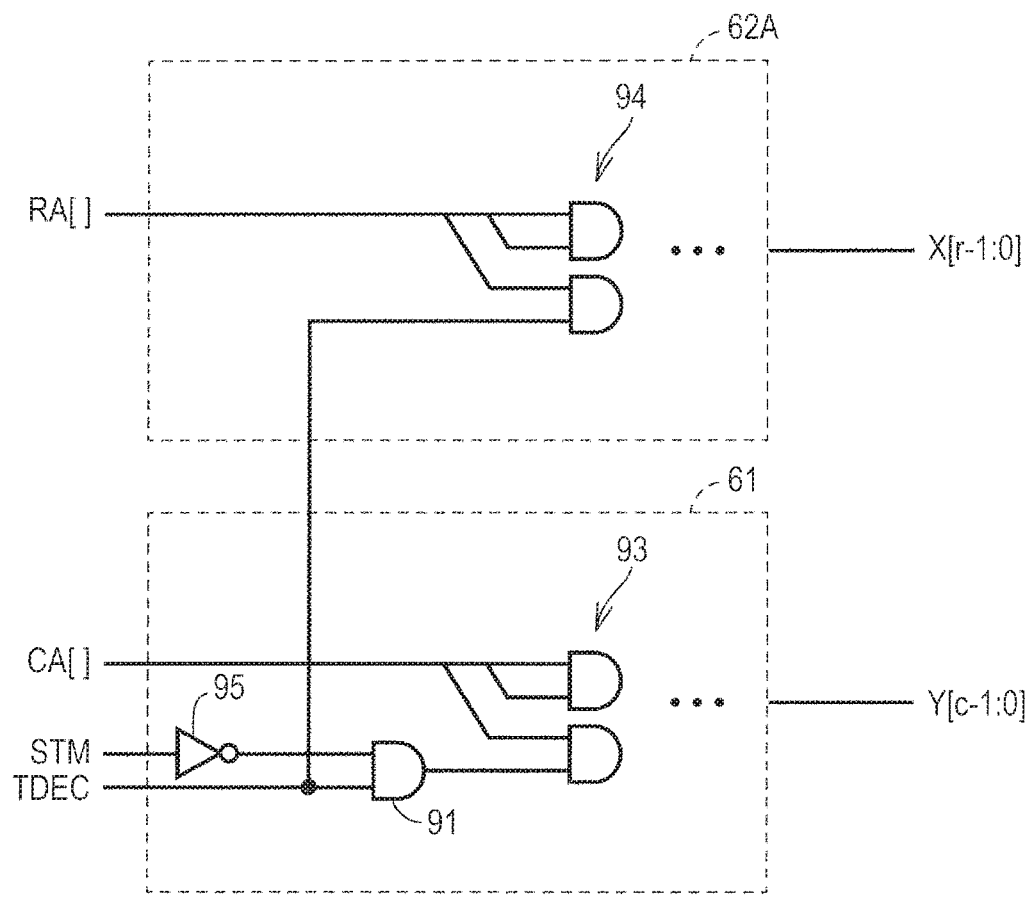
FIG. 13 is a diagram schematically illustrating the configuration of a column decoder and a row pre-decoder used in an SRAM circuit as a semiconductor device of a fourth embodiment.

FIG. 13 is a diagram schematically illustrating the configuration of a column decoder and a row pre-decoder used in an SRAM circuit as a semiconductor device of a fourth embodiment. A row pre-decoder 62A in FIG. 12 is not provided with the AND gate 92 and is configured so as to output the row selection signal X when the internal clock signal TDEC is activated regardless that the scan test mode signal STM is made active or inactive. The row pre-decoder 62A in FIG. 13 is different from the row pre-decoder 62 in FIG. 5 with respect to this point. That is, in the case of FIG. 13, although row selection is performed, column selection is not performed.

With the above-described configuration, the circuit area can be reduced without exerting influence on the data output timing in the bypass mode.

Fifth Embodiment

Each of stages in a scan chain has to be configured by a flip flop. In a normal signal processing circuit, in many cases, a latch circuit is provided but a flip flop comprised of a master latch circuit and a slave latch circuit is not provided. When a scan flip flop is newly provided for a scan test, increase in the circuit area is accompanied. In the fifth embodiment, a method of handling the problem will be described.

Sixth and seventh embodiments related to the fifth embodiment can be combined with any of the first to fourth embodiments or can be used independently of the first to fourth embodiments.

Figure 14:
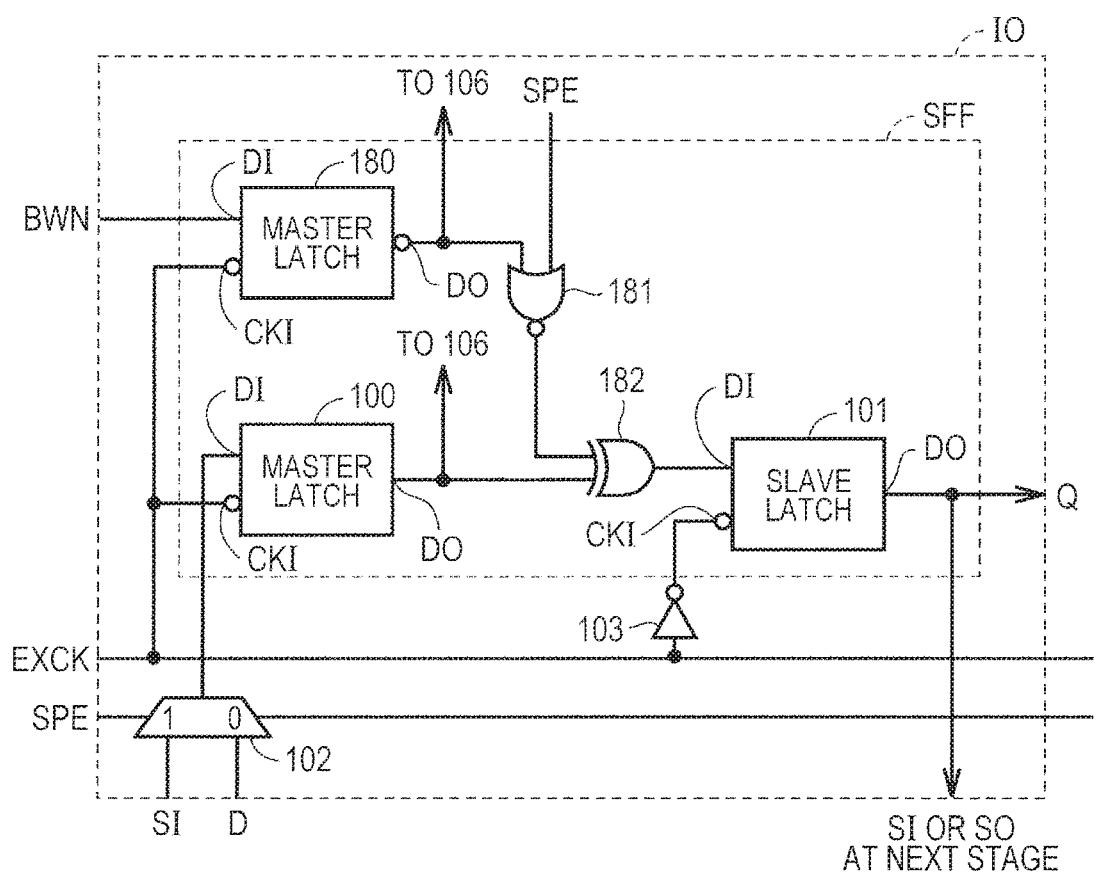
FIG. 14 is a circuit diagram illustrating the configuration of a part of an input/output circuit in an SRAM circuit as a semiconductor device of a fifth embodiment.

FIG. 14 is a circuit diagram illustrating the configuration of a part of an input/output circuit in an SRAM circuit as a semiconductor device of the fifth embodiment.

In FIG. 14, the case of performing a scan test on a write enable signal BWN of each bit as a target will be described. Since the number of bits of the write enable signal BWN becomes the same as that of the write data D, when a scan flip flop is newly provided, increase in the circuit area is remarkable. Since the same reference numeral is designated to the circuit element same as that in FIG. 6, the description will not be repeated. A similar configuration can be also applied in the case of performing a scan test on a control signal other than the write enable signal BWN.

Referring to FIG. 14, the scan flip flop SFF in the input/output circuit IO further includes a master latch circuit 180 holding the write enable signal BWN synchronously with the external clock signal EXCK, an NOR gate 181, and an exclusive OR gate 182.

The NOR gate 181 performs NOR operation between an output signal of the master latch circuit 180 and the scan path active signal SPE. When the scan path active signal SPE is in the active state (H level), an output of the NOR gate 181 is fixed at the L level. In this case, the scan in the data SI is transferred to the master latch circuit 100 and the slave latch circuit 101 via a scan path.

When the scan path active signal SPE is at the L level, an output signal of the master latch circuit 180 passes through the NOR gate 181. In this case, the exclusive OR gate 182 calculates exclusive OR between the write data D and the write enable signal BWN. The operation result is stored in the slave latch circuit 101 synchronously with the external clock signal EXCK. By the above, a failure in both the write data D and the write enable signal BWN can be detected by a scan test.

Since the write data D and the write enable signal BWN are related signals and the circuits are disposed close to each other, it is unnecessary to install wiring. Since it is unnecessary to provide a slave latch circuit for the write enable signal BWN, increase in the circuit area can be suppressed.

Sixth Embodiment

Figure 15:
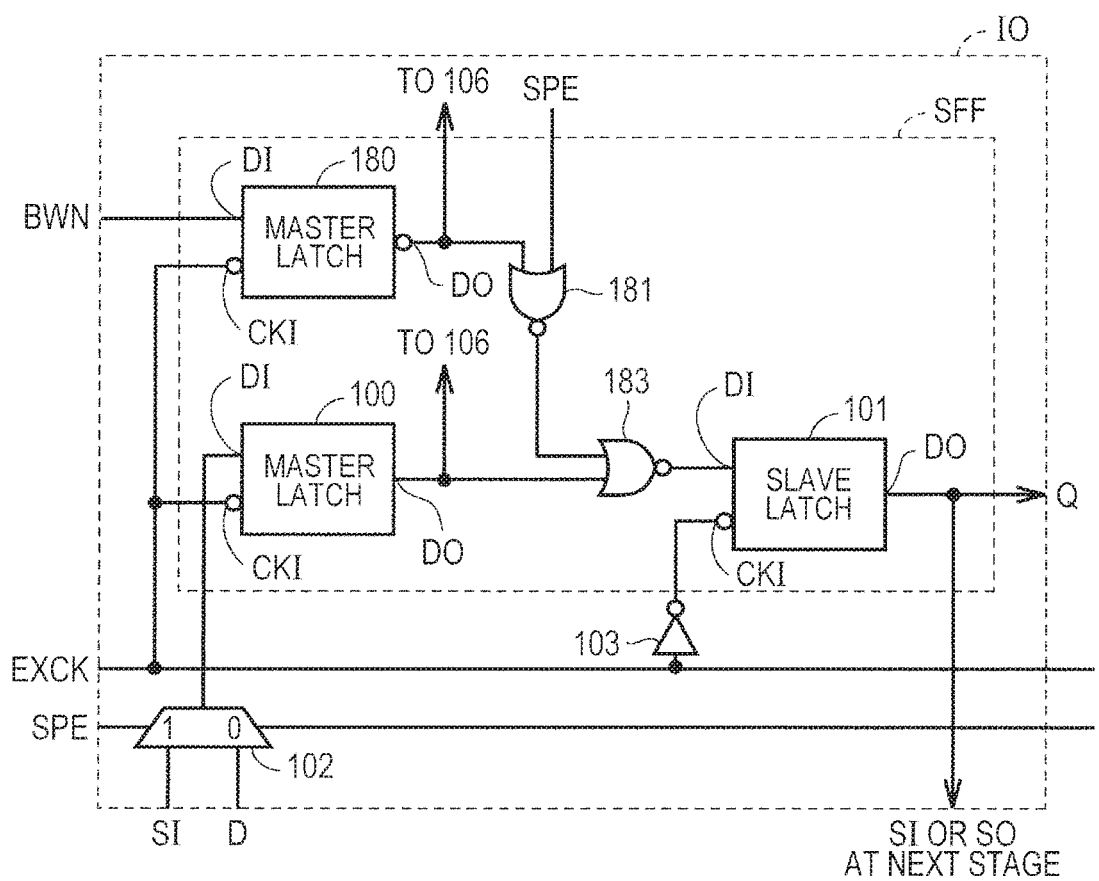
FIG. 15 is a circuit diagram illustrating the configuration of a part of an input/output circuit in an SRAM circuit as a semiconductor device of a sixth embodiment.

FIG. 15 is a circuit diagram illustrating the configuration of a part of an input/output circuit in an SRAM circuit as a semiconductor device of a sixth embodiment.

The input/output circuit IO in FIG. 15 is different from the input/output circuit IO in FIG. 14 with respect to the point that an NOR gate 183 is provided in place of the exclusive OR gate 182. Since the other points of FIG. 15 are similar to those of FIG. 14, the same reference numeral is designated to the same or corresponding part and its description will not be repeated.

By using the NOR gate 183 in place of the exclusive OR gate 182 as described above, the circuit area can be reduced. The other effects of the sixth embodiment are similar to those of the fifth embodiment.

Seventh Embodiment

Figure 16:
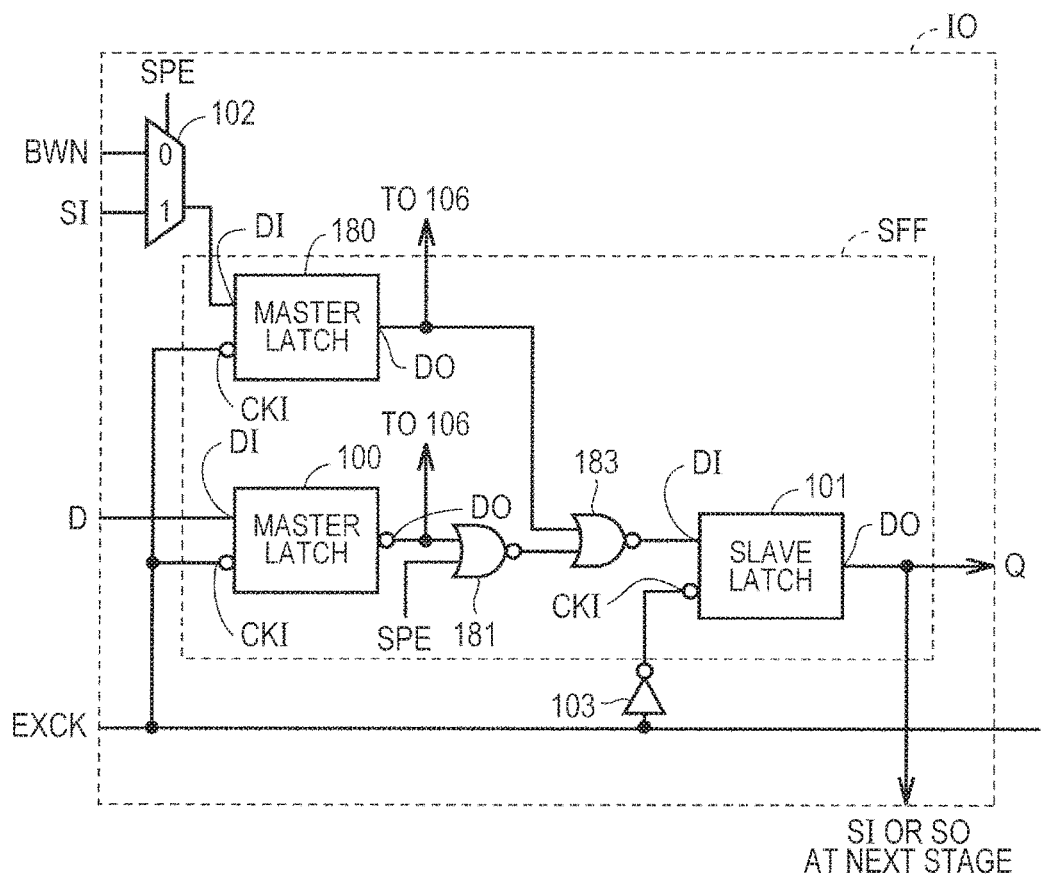
FIG. 16 is a circuit diagram illustrating the configuration of a part of an input/output circuit in an SRAM circuit as a semiconductor device of a seventh embodiment.

FIG. 16 is a circuit diagram illustrating the configuration of a part of an input/output circuit in an SRAM circuit as a semiconductor device of a seventh embodiment.

The input/output circuit IO in FIG. 16 is different from the input/output circuit IO in FIG. 15 with respect to the point that the NOR gate 181 is provided in a position between the master latch circuit 100 and the NOR gate 183 in place of a position between the master latch circuit 180 and the NOR gate 183. In this case, when SPE=1, the output of the NOR gate 181 is fixed to the L level. When SPE=0, the NOR gate 181 makes the output signal of the master latch circuit 100 pass.

Further, the input/output circuit IO in FIG. 16 is different from the input/output circuit IO in FIG. 15 with respect to the point that the multiplexer 102 is provided between a position between the input terminal of the write enable signal BWN and the master latch circuit 180 in place of a position between the input terminal of the write data D and the master latch circuit 100. In this case, the multiplexer 102 selects the write enable signal BWN when SPE=0 and selects the scan in the data SI when SPE=1. The write data D is input to the master latch circuit 100.

According to the circuit configuration of FIG. 16, a scan path to which the scan in the data SI when the scan path active signal SPE=1 is input is a path extending from the master latch circuit 180 to the slave latch circuit 101.

By the change not to provide the multiplexer 102 in a path of the write data D, setup time of the write data D can be reduced. Since the terminal of the write data D often becomes a critical path, it is advantageous in designing. The other effects of the seventh embodiment are similar to those of the fifth and sixth embodiments.

Although the present invention achieved by the inventors herein has been concretely described on the basis of the embodiments, obviously, the present invention is not limited to the foregoing embodiments but can be variously changed without departing from the gist.

What is claimed is:

1. A semiconductor device comprising:
   a plurality of memory cells arranged in rows and columns;
   a plurality of word lines each corresponding to each of the rows;
   a plurality of bit line pairs each corresponding to each of the columns;
   a sense amplifier amplifying a voltage difference between the bit line pairs;
   a scan flip flop coupled with a plurality of flip flops coupled in series, wherein the scan flip flop is coupled with the sense amplifier via a voltage setting circuit;
   a column selection circuit coupling a bit line pair in a selected column in the plurality of bit line pairs to first and second output signal lines on the basis of a column selection signal; and
   a control circuit that outputs a first control signal to the sense amplifier and outputs a second control signal to the voltage setting circuit,
   wherein the voltage setting circuit outputs a voltage to the sense amplifier according to data held in the scan flip flop, wherein the sense amplifier amplifies the voltage difference between the bit line pairs which is transmitted via the first output signal line and the second output signal line, wherein when the first control signal is activated, the sense amplifier starts amplification of a voltage difference between the first and second output signal lines, wherein when the second control signal is activated, the voltage setting circuit sets the first and second output signal lines to the voltage according to the data held in the scan flip flop, wherein the control circuit activates the first control signal at a first timing based on a clock signal regardless of whether it is time of a scan test or not, and wherein the control circuit activates the second control signal at a second timing earlier than the first timing on the basis of the clock signal at the time of the scan test.

2. The semiconductor device according to claim 1, wherein the control circuit determines a timing of activating the first control signal on the basis of a timing when the clock signal passes through a delay line.

3. The semiconductor device according to claim 1, wherein the voltage setting circuit comprises:
    a first MOS (Metal Oxide Semiconductor) transistor and a second MOS transistor coupled to each other in series between the first output signal line and a power supply node; and
    a third MOS transistor and a fourth MOS transistor coupled to each other in series between the second output signal line and the power supply node,
wherein the second control signal is supplied to gates of the first and third MOS transistors, and
wherein a high-level signal is input to a gate of one of the second and fourth MOS transistors and a low-level signal is input to the other gate in accordance with the data held in the scan flip flop.

4. The semiconductor device according to claim 3, wherein grounding voltage is applied to the power supply node, and
wherein each of the first to fourth MOS transistors is an N-channel MOS transistor.

5. The semiconductor device according to claim 3, wherein grounding voltage is applied to the power supply node,
wherein the first and third MOS transistors are P-channel MOS transistors, and
wherein the second and fourth MOS transistors are N-channel MOS transistors.

6. The semiconductor device according to claim 1, further comprising:
    a row decoder activating a word line in a selected row in the plurality of word lines on the basis of a row address; and
    a column decoder generating the column selection signal on the basis of a column address,
wherein the row decoder and the column decoder are configured so as not to perform at least one of column selection and row selection at the time of the scan test.

7. The semiconductor device according to claim 1, further comprising an input selection circuit which receives input of a third control signal, a data to be written in the plurality of memory cells, and a data for a scan test, selects the data for a scan test when the third control signal is activated, and selects the data to be written in the plurality of memory cells when the third control signal is not activated, wherein the scan flip flop includes:
    a first latch circuit to which the data selected by the input selection circuit is input; and
    a second latch circuit provided at a post stage of the first latch circuit.

8. The semiconductor device according to claim 7, wherein the scan flip flop further comprises:
    a third latch circuit to which a fourth control signal is input;
    a first logic circuit making an output signal of the third latch circuit pass when the third control signal is not activated; and
    a second logic circuit performing logical operation between the signal passed through the first logic circuit and an output signal of the first latch circuit and inputting a result of the logical operation to the second latch circuit.

9. The semiconductor device according to claim 8, wherein the second logic circuit includes an exclusive OR gate.

10. The semiconductor device according to claim 8, wherein the second logic circuit includes an OR gate.

11. The semiconductor device according to claim 1, further comprising an input selection circuit which receives input of a third control signal, a fourth control signal, and a data for a scan test, selects the data for a scan test when the third control signal is activated, and selects the fourth control signal when the third control signal is not activated,
wherein the scan flip flop includes:
    a first latch circuit to which a data to be written to the plurality of memory cells is input;
    a second latch circuit provided at a post stage of the first latch circuit;
    a third latch circuit to which the data for a scan test or the fourth control signal, selected by the input selection circuit is input;
    a first logic circuit which makes an output signal of the first latch circuit pass when the third control signal is not activated; and
    a second logic circuit performing logical operation between the signal passed through the first logic circuit and an output signal of the third latch circuit, and inputting a result of the logical operation to the second latch circuit.

12. A semiconductor device comprising:
    a memory cell;
    an input selection circuit which receives input of a first control signal, a data to be written in the memory cell, and a data for a scan test, selects the data for a scan test when the first control signal is activated, and selects the data to be written in the memory cell when the first control signal is not activated;
    a first latch circuit to which the data selected by the input selection circuit is input;
    a second latch circuit provided at a post stage of the first latch circuit;
    a third latch circuit to which a second control signal is input;
    a first logic circuit which makes an output signal of the third latch circuit pass when the first control signal is not activated; and
    a second logic circuit performing logical operation between the signal passed through the first logic circuit and an output signal of the first latch circuit, and inputting a result of the logical operation to the second latch circuit.

13. A semiconductor device comprising:

a memory cell;

an input selection circuit which receives input of a first control signal, a second control signal, and a data for a scan test, selects the data for a scan test when the first control signal is activated, and selects the second control signal when the first control signal is not activated;

a first latch circuit to which a data to be written to the memory cell is input;

a second latch circuit provided at a post stage of the first latch circuit;

a third latch circuit to which the data for a scan test or the second control signal selected by the input selection circuit is input;

a first logic circuit making an output signal of the first latch circuit pass when the first control signal is not activated; and a second logic circuit performing logical operation between the signal passed through the first logic circuit and an output signal of the third latch circuit, and inputting a result of the logical operation to the second latch circuit.

\* \* \* \* \*